United States Patent
Inoue et al.

(10) Patent No.: US 12,255,214 B2
(45) Date of Patent: *Mar. 18, 2025

(54) LIGHT DETECTION DEVICE

(71) Applicant: HAMAMATSU PHOTONICS K.K., Hamamatsu (JP)

(72) Inventors: Nao Inoue, Hamamatsu (JP); Ryosuke Koike, Hamamatsu (JP); Haruyuki Nakayama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/432,122

(22) Filed: Feb. 5, 2024

(65) Prior Publication Data

US 2024/0178249 A1 May 30, 2024

Related U.S. Application Data

(60) Continuation of application No. 18/120,594, filed on Mar. 13, 2023, which is a continuation of application (Continued)

(30) Foreign Application Priority Data

Oct. 6, 2017 (JP) ................................. 2017-196297

(51) Int. Cl.
*H01L 27/146* (2006.01)
*H01L 23/00* (2006.01)

(52) U.S. Cl.
CPC .. *H01L 27/14623* (2013.01); *H01L 27/14618* (2013.01); *H01L 27/14634* (2013.01);

(Continued)

(58) Field of Classification Search
CPC . H01L 2224/13109; H01L 2224/16145; H01L 2224/32145; H01L 2224/73204;

(Continued)

(56) References Cited

U.S. PATENT DOCUMENTS 10,672,814 B2   6/2020 Inoue et al.
11,929,378 B2 * 3/2024 Inoue ................ H01L 27/14634

(Continued)

FOREIGN PATENT DOCUMENTS

CN  102727212 A  10/2012
CN  104584238 A   4/2015

(Continued)

*Primary Examiner* — Robert G Bachner
(74) *Attorney, Agent, or Firm* — Faegre Drinker Biddle & Reath LLP

(57) ABSTRACT

A light detection device includes: a back-illuminated light receiving element; a circuit element; a connection member; an underfill; and a light shielding mask. The light shielding mask includes a frame having an opening and a light shielding layer formed on an inner surface of the opening. A first opening edge on the side of the circuit element in the opening is located at the outside of an outer edge of the light receiving element. A second opening edge opposite to the circuit element in the opening is located at the inside of the outer edge of the light receiving element. The opening is narrowed from the first opening edge toward the second opening edge. A width of the frame increases from the first opening edge toward the second opening edge. The underfill reaches a gap between the light receiving element and the light shielding layer.

34 Claims, 11 Drawing Sheets

Related U.S. Application Data

No. 17/375,176, filed on Jul. 14, 2021, now Pat. No. 11,652,120, which is a continuation of application No. 16/827,866, filed on Mar. 24, 2020, now Pat. No. 11,101,310, which is a division of application No. 16/152,494, filed on Oct. 5, 2018, now Pat. No. 10,672,814.

(52) U.S. Cl.
CPC .... *H01L 27/14636* (2013.01); *H01L 27/1464* (2013.01); *H01L 27/14643* (2013.01); *H01L 24/13* (2013.01); *H01L 24/16* (2013.01); *H01L 24/32* (2013.01); *H01L 24/73* (2013.01); *H01L 2224/13109* (2013.01); *H01L 2224/16145* (2013.01); *H01L 2224/2919* (2013.01); *H01L 2224/32145* (2013.01); *H01L 2224/73204* (2013.01)

(58) Field of Classification Search
CPC . H01L 2924/00012; H01L 2924/00014; H01L 2224/2919; H01L 24/13; H01L 24/16; H01L 24/32; H01L 24/73; H01L 27/14618; H01L 27/14623; H01L 27/14634; H01L 27/14636; H01L 27/1464; H01L 27/14643
See application file for complete search history.

(56) References Cited

U.S. PATENT DOCUMENTS

| | | |
|---|---|---|
| 2005/0051859 A1 | 3/2005 | Hoffman |
| 2007/0163992 A1 | 7/2007 | Michalk et al. |
| 2009/0180013 A1 | 7/2009 | Kinoshita |
| 2017/0033142 A1 | 2/2017 | Kobayashi et al. |

FOREIGN PATENT DOCUMENTS

| | | |
|---|---|---|
| CN | 104981907 A | 10/2015 |
| JP | H03-038884 A | 2/1991 |
| JP | H06-143884 A | 5/1994 |
| JP | 2001-021976 A | 1/2001 |
| JP | 2004-260138 A | 9/2004 |
| JP | 2004-349463 A | 12/2004 |
| JP | 2005-317745 A | 11/2005 |
| JP | 2006-067604 A | 3/2006 |
| JP | 2007-014651 A | 1/2007 |
| JP | 2008-210846 A | 9/2008 |
| JP | 2009-111089 A | 5/2009 |
| JP | 2009-111090 A | 5/2009 |
| JP | 2009-170977 A | 7/2009 |
| JP | 2014-099468 A | 5/2014 |
| JP | 2014-132644 A | 7/2014 |
| WO | WO 2015/159512 A1 | 10/2015 |
| WO | WO-2016/152431 A1 | 9/2016 |
| WO | WO 2017/061296 A1 | 4/2017 |

\* cited by examiner

LIGHT DETECTION DEVICE

CROSS-REFERENCE TO RELATED APPLICATIONS

This application is a continuation application of U.S. patent application Ser. No. 18/120,594, filed Mar. 13, 2023, which is a continuation application of U.S. patent application Ser. No. 17/375,176, filed Jul. 14, 2021, which is a continuation application of U.S. patent application Ser. No. 16/827,866, filed Mar. 24, 2020, which is a divisional application of U.S. patent application Ser. No. 16/152,494, filed Oct. 5, 2018, which claims the benefit of priority to Japanese Patent Application No. 2017-196297, filed Oct. 6, 2017, the entire contents of each of which are incorporated herein by reference.

TECHNICAL FIELD

The present disclosure relates to a light detection device.

BACKGROUND

As a light detection device, there is known a light detection device including a back-illuminated light receiving element which includes a plurality of light receiving portions, a circuit element, a bump which is disposed between the light receiving element and the circuit element, and an underfill which is disposed between the light receiving element and the circuit element. In such a light detection device, there is a case in which the underfill reaches a side surface of the light receiving element in order to reliably bond the light receiving element and the circuit element to each other.

However, when the underfill reaches the side surface of the light receiving element, there is a case in which light incident and refracted by the underfill is incident from the side surface of the light receiving element to the light receiving portion since the light receiving element is of a back illumination type. Since such light is noise light, the detection accuracy of the light detection device is degraded when such light is incident to the light receiving portion.

In order to solve the above-described problems, there is proposed a light detection device in which a resin containing a filler having a light shielding property is used as an underfill (for example, see Japanese Unexamined Patent Publication No. 2009-111090).

SUMMARY

However, there is concern that light cannot be sufficiently shielded in accordance with a wavelength even when the resin containing the filler having the light shielding property is used as the underfill.

An object of the present disclosure is to provide a highly reliable light detection device.

A light detection device of the present disclosure includes: a back-illuminated light receiving element including a plurality of light receiving portions; a circuit element; a connection member disposed between the light receiving element and the circuit element and configured to electrically and physically connects the light receiving element and the circuit element to each other; an underfill disposed between the light receiving element and the circuit element; and a frame-shaped light shielding mask disposed on the circuit element to surround the light receiving element when viewed from a light incident direction to the light receiving element, in which the light shielding mask includes a frame having an opening in which the light receiving element is located and a light shielding layer formed on an inner surface of the opening, in which a first opening edge on the side of the circuit element in the opening is located at the outside of an outer edge of the light receiving element when viewed from the light incident direction, in which a second opening edge opposite to the circuit element in the opening is located at the inside of the outer edge of the light receiving element when viewed from the light incident direction, in which the opening is narrowed from the first opening edge toward the second opening edge, in which a width of the frame increases from the first opening edge toward the second opening edge, and in which the underfill reaches a gap between the light receiving element and the light shielding layer formed on the inner surface of the opening.

In the light detection device, the light receiving element is located at the inside of the opening of the frame and the light shielding layer is formed on the inner surface of the opening of the frame. Further, the opening of the frame is narrowed from the first opening edge on the side of the circuit element toward the second opening edge opposite to the circuit element. Accordingly, even when light (stray light) is incident from the outside of the opening of the frame to the light shielding layer, the light is easily reflected toward, for example, the opposite side to the light receiving element. Thus, it is possible to prevent degradation in the detection accuracy of the light detection device due to the light incident from the side surface of the light receiving element to the light receiving portion. Further, in the light detection device, the underfill reaches a gap between the light receiving element and the light shielding layer. At this time, since the opening of the frame is narrowed from the first opening edge on the side of the circuit element toward the second opening edge opposite to the circuit element, the underfill reaching a gap between the light receiving element and the light shielding layer easily becomes stable. Thus, it is possible to obtain a stable fixing strength in the entire periphery of the light shielding mask. Furthermore, in the light detection device, the width of the frame increases from the first opening edge on the side of the circuit element toward the second opening edge opposite to the circuit element. Accordingly, the strength of the light shielding mask surrounding the light receiving element increases. Thus, it is possible to protect the light receiving element from an external force. Further, since the light receiving element, the circuit element, and the light shielding mask are fixed together by the underfill which is the same material, these components can be easily and stably fixed. With the above-described configuration, it is possible to obtain the highly reliable light detection device.

In the light detection device of the present disclosure, the light receiving element may be in contact with the light shielding layer formed on the inner surface of the opening. Accordingly, since the position of the light shielding mask with respect to the light receiving element becomes stable, the above-described operations and effects more easily achieved.

In the light detection device of the present disclosure, the underfill may reach a position in which the light receiving element is in contact with the light shielding layer formed on the inner surface of the opening. Accordingly, it is possible to obtain a more stable fixing strength in the entire periphery of the light shielding mask.

Furthermore, it is possible to prevent degradation in the light receiving element due to the intrusion of moisture or the like from the side surface of the light receiving element.

In the light detection device of the present disclosure, the plurality of light receiving portions may be arranged along a predetermined direction and the light receiving element and the light shielding mask may have an elongated shape in which the predetermined direction is a longitudinal direction. When the plurality of light receiving portions are arranged along the predetermined direction, the light is easily incident from the side surface of the light receiving element to all light receiving portions and the strength of the light receiving element easily decreases. Thus, when the plurality of light receiving portions are arranged along the predetermined direction, a configuration in which the light shielding mask is provided and the underfill reaches a gap between the light receiving element and the light shielding layer is particularly effective.

In the light detection device of the present disclosure, the frame and a substrate of the circuit element may be formed of the same material. Accordingly, it is possible to prevent the deformation of at least one of the circuit element and the light shielding mask due to a difference in thermal expansion coefficient between the substrate of the circuit element and the frame of the light shielding mask.

In the light detection device of the present disclosure, the frame and the substrate of the circuit element may be formed of silicon. Accordingly, it is possible to prevent the deformation of at least one of the circuit element and the light shielding mask due to a difference in thermal expansion coefficient between the substrate of the circuit element and the frame of the light shielding mask by using versatile materials.

In the light detection device of the present disclosure, a substrate of the light receiving element may be formed of a compound semiconductor. When the substrate of the light receiving element is formed of the compound semiconductor, the side surface of the substrate of the light receiving element is easily chipped. Thus, when the substrate of the light receiving element is formed of the compound semiconductor, a configuration in which the light shielding mask is provided and the underfill reaches a gap between the light receiving element and the light shielding layer is particularly effective in order to suppress the chipping of the side surface of the substrate of the light receiving element. Furthermore, when the substrate of the light receiving element is formed of the compound semiconductor, the chipping or the like occurs on the side surface of the substrate of the light receiving element at the time of manufacturing the light detection device in many cases. For this reason, when stray light is incident, the uniformity among the plurality of light receiving portions is easily degraded due to the irregular reflection or the like. Thus, when the substrate of the light receiving element is formed of the compound semiconductor, a configuration in which the light shielding mask is provided and the underfill reaches a gap between the light receiving element and the light shielding layer is particularly effective in order to ensure the uniformity among the plurality of light receiving portions.

In the light detection device of the present disclosure, the light shielding layer may be formed on a surface on the side of the circuit element in the frame. Accordingly, it is possible to prevent, for example, a problem in which the light incident to the circuit element through the surface on the side of the circuit element in the frame is scattered and is incident to the light receiving portion of the light receiving element.

In the light detection device of the present disclosure, the underfill may reach a portion in which a surface on the light incident side in the light receiving element intersects a side surface of the light receiving element. Accordingly, since it is possible to cover the side surface of the light receiving element, it is possible to stably fix the light receiving element. Furthermore, it is possible to more reliably suppress the intrusion of moisture onto the mounting surface of the light receiving element.

In the light detection device of the present disclosure, the underfill may reach an outer edge of the surface on the light incident side in the light receiving element. Accordingly, since it is possible to cover the intersection portion between the surface on the light incident side in the light receiving element and the side surface of the light receiving element, it is possible to more stably fix the light receiving element. Furthermore, it is possible to more reliably suppress the intrusion of moisture onto the mounting surface of the light receiving element.

In the light detection device of the present disclosure, at least one end portion of the second opening edge in the predetermined direction may be located at the outside of at least one end portion of the outer edge of the light receiving element in the predetermined direction when viewed from the light incident direction. Accordingly, a portion between one end portion of the light receiving element in the predetermined direction and one end portion of the light shielding mask in the predetermined direction can serve as an underfill resin releasing hole at the time of manufacturing the light detection device and can suppress an extra underfill from protruding from the surface on the light incident side in the light receiving element in the manufactured light detection device.

A light detection device of the present disclosure includes: a light receiving element unit including a plurality of back-illuminated light receiving elements respectively including a plurality of light receiving portions; a circuit element; a connection member disposed between the light receiving element unit and the circuit element and configured to electrically and physically connect the light receiving element unit and the circuit element to each other; an underfill disposed between the light receiving element unit and the circuit element; and a frame-shaped light shielding mask disposed on the circuit element to surround the light receiving element unit when viewed from a light incident direction to the light receiving element unit, in which the light shielding mask includes a frame having an opening in which the light receiving element unit is located and a light shielding layer formed on an inner surface of the opening, in which a first opening edge on the side of the circuit element in the opening is located at the outside of an outer edge of the light receiving element unit when viewed from the light incident direction, in which a second opening edge opposite to the circuit element in the opening is located at the inside of the outer edge of the light receiving element unit when viewed from the light incident direction, in which the opening is narrowed from the first opening edge toward the second opening edge, in which a width of the frame increases from the first opening edge toward the second opening edge, and in which the underfill reaches a gap between the light receiving element unit and the light shielding layer formed on the inner surface of the opening.

According to the light detection device, the reliability is improved similarly to the above-described light detection device. Further, it is possible to increase the size of the light receiving element unit while suppressing a decrease in yield and a decrease in mechanical strength.

DETAILED DESCRIPTION

Figure 1:
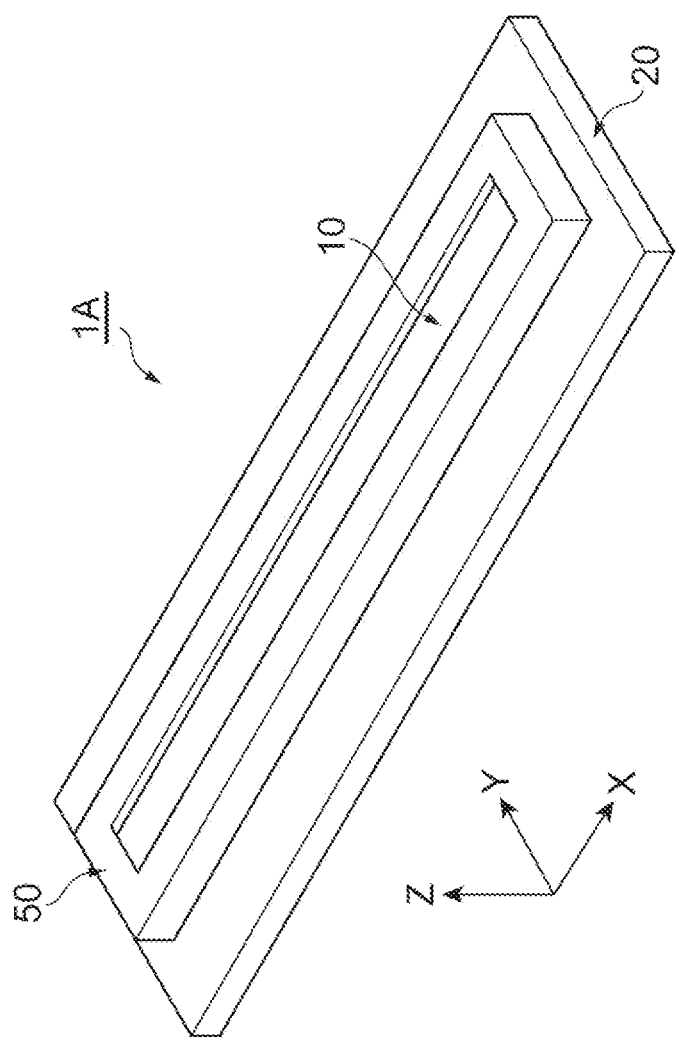
FIG. 1 is a perspective view of a light detection device of a first embodiment.

Hereinafter, an embodiment of the present disclosure will be described in detail with reference to the drawings. Additionally, in drawings, the same reference numerals will be given to the same or equivalent components and a repetitive description thereof will be omitted.

First Embodiment

Figure 2:
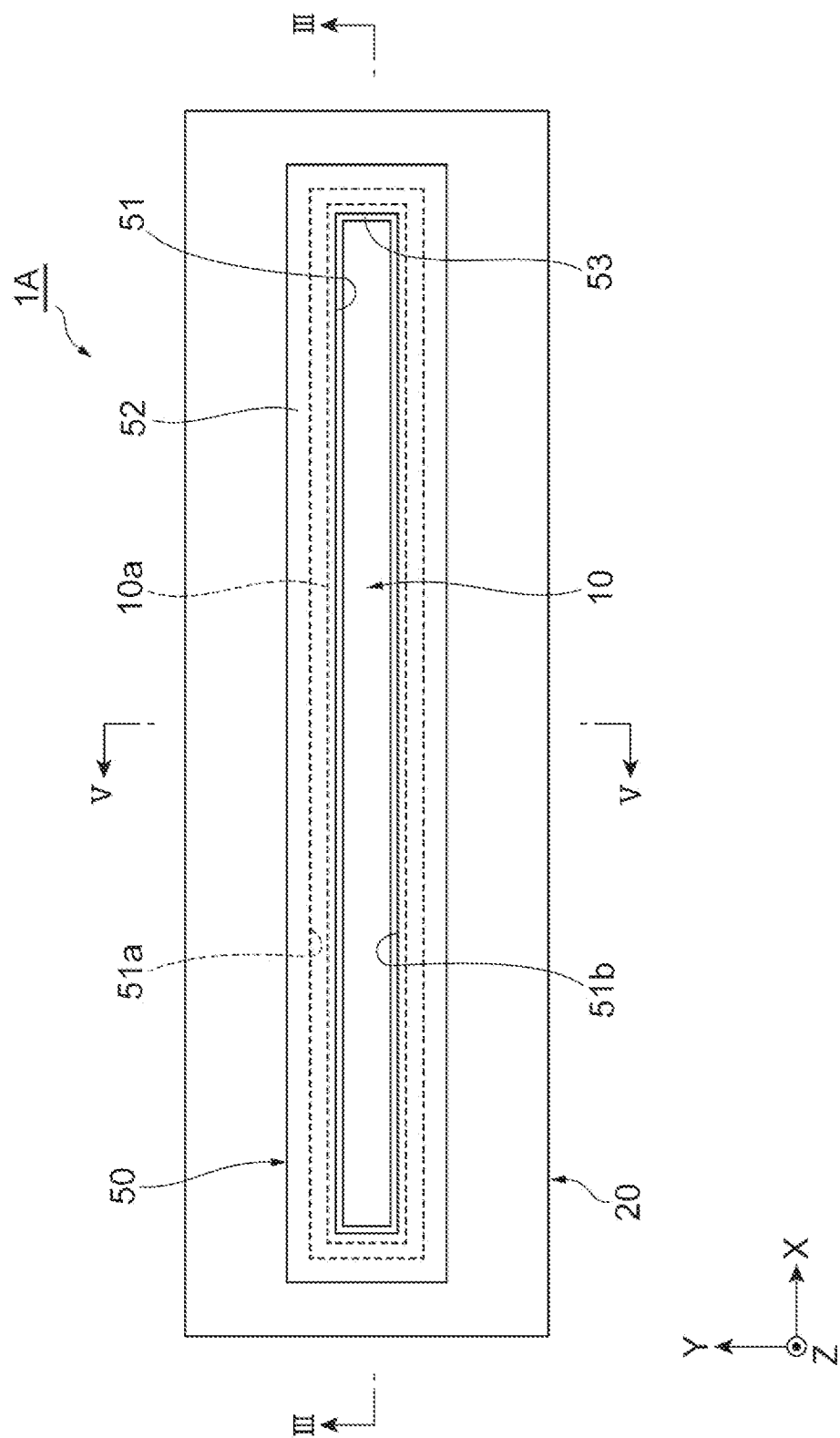
FIG. 2 is a plan view of the light detection device illustrated in FIG. 1.
Figure 3:
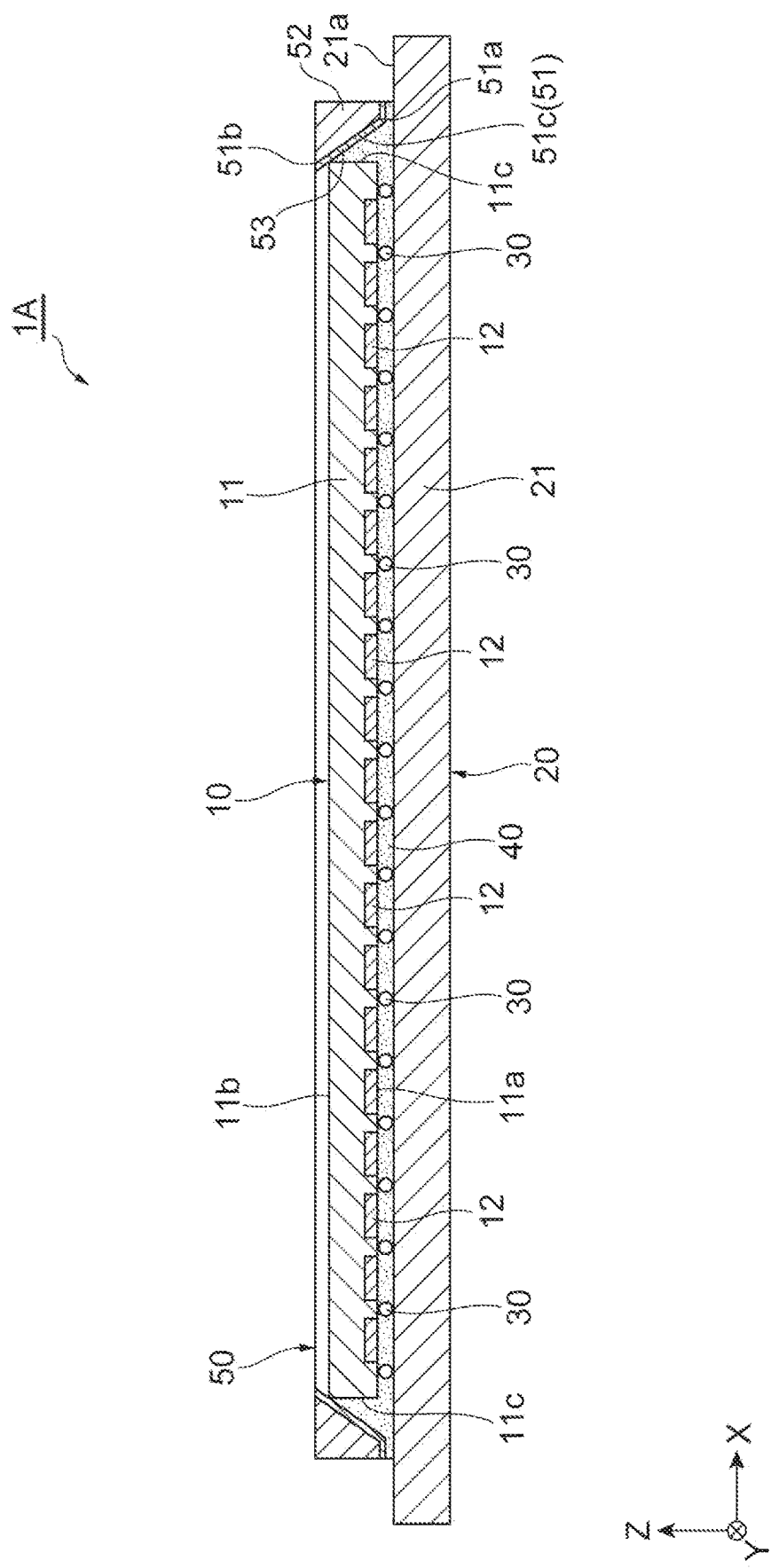
FIG. 3 is a cross-sectional view of the light detection device taken along a line III-III illustrated in FIG. 2.

As illustrated in FIGS. 1, 2, and 3, a light detection device 1A of a first embodiment includes a light receiving element 10, a circuit element 20, a plurality of bumps (connection members) 30, an underfill 40, and a light shielding mask 50. Hereinafter, a light incident direction to the light receiving element 10 will be referred to as a Z-axis direction, a direction perpendicular to the Z-axis direction will be referred to as an X-axis direction, and a direction perpendicular to the Z-axis direction and the X-axis direction will be referred to as a Y-axis direction.

The light receiving element 10 includes a substrate 11 which is formed of a compound semiconductor such as InGaAs. The substrate 11 includes a principal surface 11a and a principal surface 11b which face each other in the Z-axis direction. A portion along the principal surface 11a of the substrate 11 is provided with a plurality of light receiving portions 12. The plurality of light receiving portions 12 are arranged in one dimension along the X-axis direction (a predetermined direction). Each of the light receiving portions 12 is, for example, a photodiode in which a second conductive region is formed in a portion along the principal surface 11a of the first conductive substrate 11. The light receiving element 10 receives the light incident from the principal surface 11b of the substrate 11 by each light receiving portion 12. That is, the light receiving element 10 is a back-illuminated light receiving element. The light receiving element 10 is formed in an elongated shape in which the X-axis direction is a longitudinal direction. As an example, the light receiving element 10 is formed in a rectangular plate shape in which the X-axis direction is a longitudinal direction and the length in the X-axis direction, the width in the Y-axis direction, and the thickness in the Z-axis direction are respectively 13.18 mm, 0.7 mm, and 0.3 mm.

The circuit element 20 includes a substrate 21 formed of silicon. The substrate 21 is provided with a signal readout circuit, a signal processing circuit, a signal output circuit, and the like. The substrate 21 includes a principal surface 21a on which the light receiving element is mounted. The circuit element 20 processes an electric signal output from each light receiving portion 12 of the light receiving element 10 in response to the light receiving amount. The circuit element 20 is, for example, a CMOS readout circuit (ROIC: readout integrated circuit).

The plurality of bumps 30 are disposed between the light receiving element 10 and the circuit element 20. The plurality of bumps 30 electrically and physically connect the light receiving element and the circuit element 20 to each other between the principal surface 11a of the substrate 11 and the principal surface 21a of the substrate 21 facing each other in the Z-axis direction. More specifically, the principal surface 11a of the substrate 11 and the principal surface 21a of the substrate 21 are respectively provided with a plurality of electrode pads (not illustrated) and each bump 30 electrically and physically connects the electrode pads facing each other in the Z-axis direction. Each bump 30 is, for example, an In bump.

The underfill 40 is disposed between at least the light receiving element 10 and the circuit element 20. The underfill 40 is formed of an epoxy-based resin, a urethane-based resin, a silicone-based resin, an acrylic-based resin, a composite resin thereof, or the like. The underfill 40 is filled in a region between the light receiving element 10 and the circuit element 20 and seals the plurality of bumps 30 and the plurality of electrode pads. In the light detection device 1A, it is possible to protect each bump 30, ensure an insulation property between the adjacent bumps 30, and ensure a fixing strength between the light receiving element 10 and the circuit element 20 by the underfill 40.

The light shielding mask 50 is formed in a frame shape and is disposed on the circuit element 20 (specifically, the principal surface 21a of the substrate 21) to surround the light receiving element 10 when viewed from the Z-axis direction. The light shielding mask 50 is formed in an elongated shape in which the X-axis direction is a longitudinal direction. The light shielding mask 50 includes a frame 52 provided with an opening 51 and a light shielding layer 53.

The light receiving element 10 is located at the inside of the opening 51. That is, the light receiving element 10 is located between a first opening edge 51a and a second opening edge 51b. The first opening edge 51a is the opening edge on the side of the circuit element in the opening 51 and the second opening edge 51b is the opening edge opposite to the circuit element 20 in the opening 51. The first opening edge 51a is located at the outside of the outer edge 10a of the light receiving element 10 when viewed from the Z-axis direction and the second opening edge 51b is located at the inside of the outer edge 10a of the light receiving element 10 when viewed from the Z-axis direction (see FIG. 2). Additionally, the side surface 11c of the substrate 11 corresponds to the outer edge 10a of the light receiving element 10 when viewed from the Z-axis direction.

Figure 4:
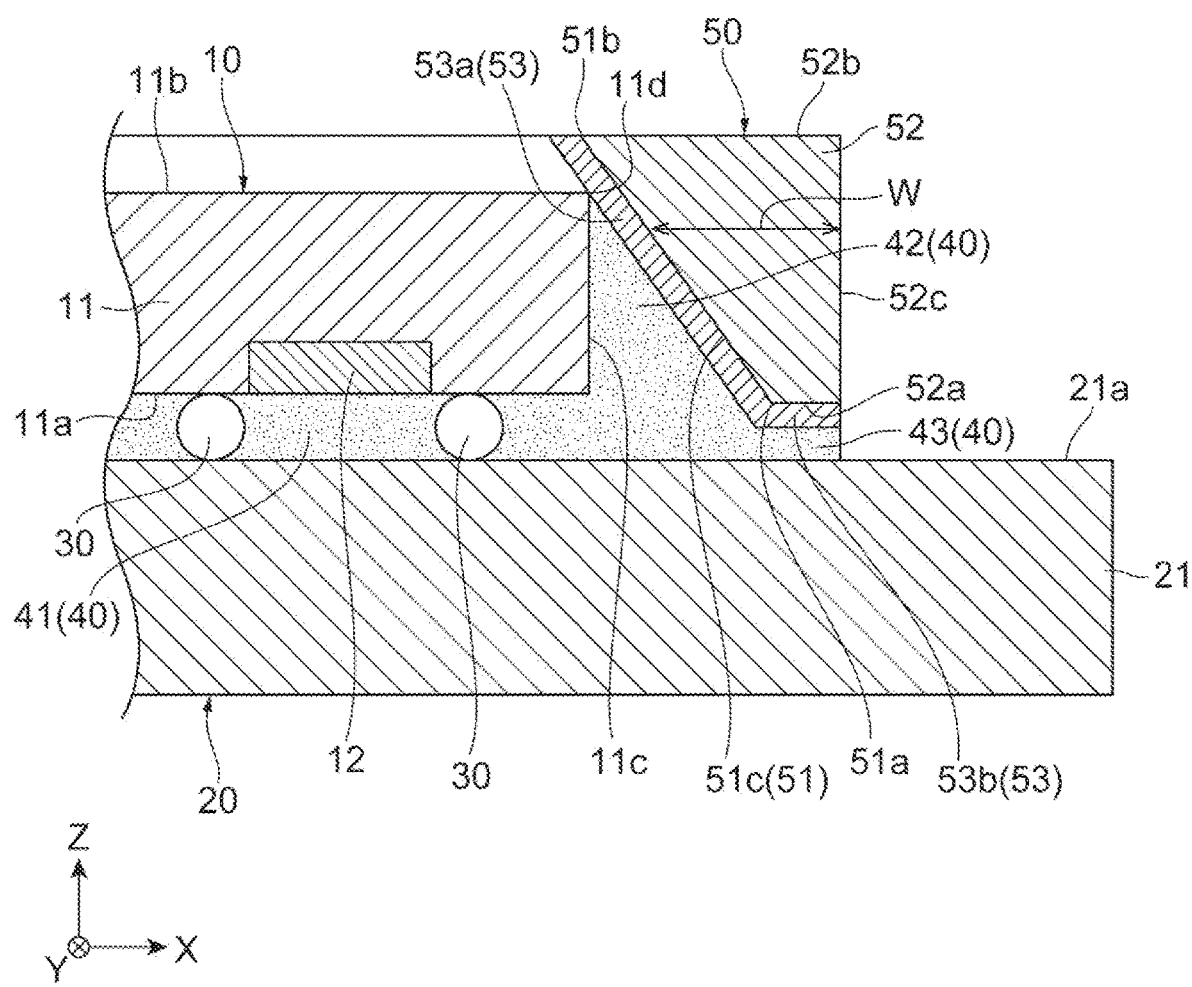
FIG. 4 is an enlarged cross-sectional view of the light detection device illustrated in FIG. 3.
Figure 5:
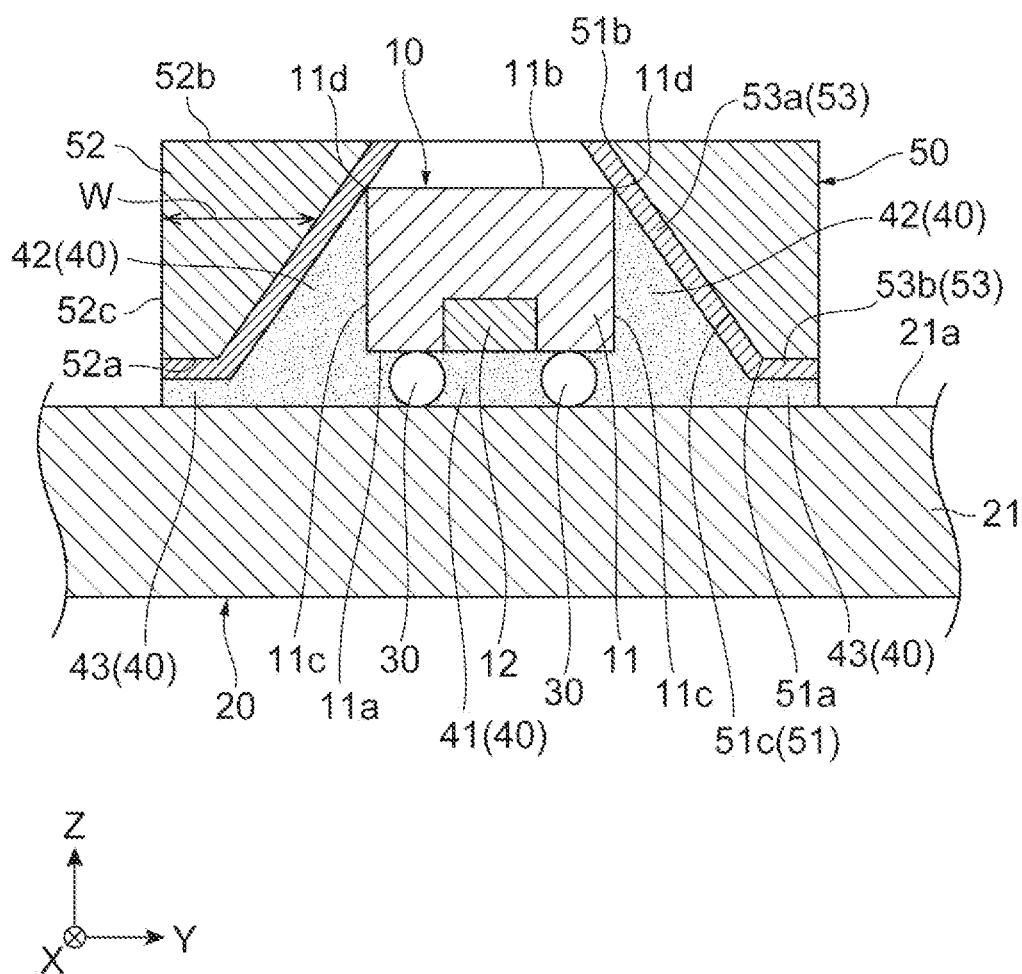
FIG. 5 is an enlarged cross-sectional view of the light detection device taken along a line V-V illustrated in FIG. 2.

As illustrated in FIGS. 3, 4, and 5, the frame 52 is formed in a frame shape by silicon. The frame 52 includes a surface 52a and a surface 52b which are perpendicular to the Z-axis direction and includes a side surface 52c which is parallel to the Z axis. The opening 51 opens to the surface 52a on the side of the circuit element 20 and the surface 52b opposite to the circuit element 20. The opening 51 is narrowed from the first opening edge 51a toward the second opening edge 51b and the width W of the frame 52 increases from the first opening edge 51a toward the second opening edge 51b. An inclination angle of the inner surface 51c of the opening 51 (an angle formed between the surface 52b of the frame 52 and the inner surface 51c of the opening 51) is an angle equal to or larger than 30° and equal to or smaller than 60° (in the light detection device 1A, 54.7°). Here, the width W of the frame 52 is the "width in a direction perpendicular to the extension direction" of the "extension portion formed to surround the opening 51 (one side portion with respect to the opening 51)" when viewed from the Z-axis direction (that is, the light incident direction to the light receiving element 10).

An example of the shape of the frame 52 is as follows. The frame 52 is formed in a rectangular frame shape in which the X-axis direction is a longitudinal direction and the length in the X-axis direction, the width in the Y-axis direction, and the thickness in the Z-axis direction are respectively 15 mm, 2 mm, and 0.32 mm. The opening 51 is formed in a truncated pyramid shape. The first opening edge 51a is formed in a rectangular shape in which the X-axis direction is a longitudinal direction and the length in the X-axis direction and the width in the Y-axis direction are respectively 13.56 mm and 1.08 mm. Then, the second opening edge 51b is formed in a rectangular shape in which the X-axis direction is a longitudinal direction and the length in the X-axis direction and the width in the Y-axis direction are respectively 13.11 mm and 0.63 mm. The frame 52 having such a shape can be obtained, for example, by performing alkali etching on a single crystal silicon substrate.

The light shielding layer 53 is formed on the inner surface 51c of the opening 51 and the surface 52a of the frame 52. That is, the light shielding layer 53 is integrally formed by including a first portion 53a formed on the inner surface 51c of the opening 51 and a second portion 53b formed on the surface 52a of the frame 52. A portion along the second opening edge 51b opposite to the circuit element 20 in the light shielding layer 53 protrudes on the outer edge portion of the light receiving element 10 (specifically, on the outer edge portion of the principal surface 11b of the substrate 11). The light shielding layer 53 is formed of metal such as Al. The thickness of the light shielding layer 53 may be a thickness in which stray light can be sufficiently reflected and is, for example, 1 µm. The light shielding layer 53 can be obtained, for example, by depositing metal on the inner surface 51c of the opening 51 and the surface 52a of the frame 52. Additionally, it is desirable that the thickness of the light shielding layer 53 formed on the surface 52a of the frame 52 is larger than the thickness of the light shielding layer 53 formed on the inner surface 51c of the opening 51. In that case, it is desirable that the thickness of the light shielding layer 53 formed on the inner surface 51c of the opening 51 decreases from the first opening edge 51a toward the second opening edge 51b. In this way, when the thickness of the light shielding layer 53 formed on the surface 52a of the frame 52 is set to be large, it is possible to cover the corner portion of the first opening edge 51a by the light shielding layer 53 having a sufficient thickness and to prevent a problem in which the thickness of the light shielding layer 53 formed on the inner surface 51c of the opening 51 increases more than necessary (that is, an unnecessary material may not be used to form the light shielding layer 53).

The light receiving element 10 is in contact with the light shielding layer 53 formed on the inner surface 51c of the opening 51 (that is, the first portion 53a of the light shielding layer 53). More specifically, a corner portion 11d which is an intersection line between the side surface 11c of the substrate 11 and the principal surface 11b of the substrate 11 in the light receiving element 10 is in contact with the first portion 53a of the light shielding layer 53. The underfill 40 reaches a gap between the light receiving element 10 (specifically, the side surface 11c of the substrate 11) and the first portion 53a of the light shielding layer 53 and reaches a position in which the light receiving element 10 is in contact with the first portion 53a of the light shielding layer 53. That is, the underfill 40 is filled in a region between the light receiving element 10 and the first portion 53a of the light shielding layer 53. Furthermore, the underfill 40 is formed on the surface 52a of the frame 52 and reaches a gap between the light shielding layer 53 (that is, the second portion 53b of the light shielding layer 53) and the principal surface 21a of the substrate 21 of the circuit element 20 to fill the gap. In this way, the underfill 40 is integrally formed by including a first portion 41 which is disposed between the light receiving element 10 and the circuit element 20, a second portion 42 which is disposed between the light receiving element 10 and the first portion 53a of the light shielding layer 53, and a third portion 43 which is disposed between the circuit element 20 and the light shielding mask 50.

Additionally, the light detection device 1A is manufactured as follows. First, the light receiving elements 10 are mounted onto the circuit element 20 by the plurality of bumps 30. Next, an underfill resin is coated in the periphery of the light receiving element 10. Next, the light shielding mask 50 is mounted on the circuit element 20 to cover the light receiving element 10. At this time, since the light receiving element 10 is in contact with the first portion 53a of the light shielding layer 53, the light shielding mask 50 is appropriately positioned to the light receiving element 10. Then, in this state, the underfill resin spreads in a region between the light receiving element and the circuit element 20, a region between the light receiving element 10 and the first portion 53a of the light shielding layer 53, and a region between the circuit element 20 and the second portion 53b of the light shielding layer 53. Meanwhile, since the opening 51 is narrowed from the first opening edge 51a toward the second opening edge 51b and the light receiving element 10 is in contact with the first portion 53a of the light shielding layer 53, it is possible to suppress the leakage of the underfill resin onto the principal surface 11b of the substrate 11 of the light receiving element 10. Even when the underfill resin reaches the principal surface 11b of the substrate 11 beyond the corner portion 11d of the substrate 11, the underfill resin easily stays along the second opening edge 51b (that is, the underfill resin easily remains on the outer edge portion of the principal surface 11b) since the second opening edge 51b is located at the inside of the outer edge 10a of the light receiving element 10. As a result, it is possible to suppress the leakage of the underfill resin to the regions on the plurality of light receiving portions 12 of the principal surface 11b. Next, the underfill resin is thermally cured so that the light shielding mask 50 is fixed by the underfill 40, thereby obtaining the light detection device 1A.

As described above, in the light detection device 1A, the light receiving element 10 is located at the inside of the opening 51 of the frame 52 and the light shielding layer 53 is formed on the inner surface 51c of the opening 51 of the frame 52. Further, the opening 51 of the frame 52 is narrowed from the first opening edge 51a on the side of the circuit element 20 toward the second opening edge 51b opposite to the circuit element 20. Accordingly, even when light (stray light) is incident from the outside of the opening 51 of the frame 52 into the light shielding layer 53, the light is easily reflected to, for example, the opposite side to the light receiving element 10. Thus, it is possible to prevent degradation in the detection accuracy of the light detection device 1A when the light is incident from the side surface of the light receiving element 10 (in the light detection device 1A, the side surface 11c of the substrate 11) to the light receiving portion 12. Further, in the light detection device 1A, the underfill 40 reaches a gap between the light receiving element 10 and the light shielding layer 53. At this time, since the opening 51 of the frame 52 is narrowed from the first opening edge 51a on the side of the circuit element 20 toward the second opening edge 51b opposite to the circuit element 20, the underfill 40 reaching a gap between the light receiving element 10 and the light shielding layer 53 easily becomes stable. Thus, it is possible to obtain a stable fixing strength in the entire periphery of the light shielding mask 50. Furthermore, in the light detection device 1A, the width W of the frame 52 increases from the first opening edge 51a on the side of the circuit element 20 toward the second opening edge 51b opposite to the circuit element 20. Accordingly, the strength of the light shielding mask 50 surrounding the light receiving element 10 increases. Thus, it is possible to protect the light receiving element 10 from an external force. Further, since the light receiving element 10, the circuit element 20, and the light shielding mask 50 are fixed together by the underfill 40 which is the same material, these components can be easily and stably fixed. Accordingly, it is possible to obtain the highly reliable light detection device 1A. The configuration of the light detection device 1A is extremely effective when the light detection device 1A is configured as a wafer level chip size package (CSP).

For example, the amount of the underfill 40 reaching each side surface of the light receiving element 10 differs due to the side surface of the light receiving element 10 or differs due to a position within one side surface unless a method of highly accurately disposing light shielding plates and preventing the leakage of the underfill 40 from a gap between the adjacent light shielding plates even when the plurality of light shielding plates are disposed to respectively face the plurality of side surfaces of the light receiving elements 10. In such a configuration, a high-strength portion and a low-strength portion are generated and hence breakage easily occurs from the low-strength portion. In contrast, in the light detection device 1A of the above-described first embodiment, since the frame-shaped light shielding mask 50 is disposed to surround the light receiving element 10, the amount of the underfill 40 reaching each side surface of the light receiving element 10 becomes uniform in any position of each side surface of the light receiving element 10. Thus, in the light detection device 1A of the above-described first embodiment, uniform strength is obtained and hence breakage is suppressed.

Further, in the light detection device 1A, the light receiving element 10 is in contact with the light shielding layer 53 formed on the inner surface 51c of the opening 51 (that is, the first portion 53a of the light shielding layer 53). Accordingly, since the position of the light shielding mask 50 with respect to the light receiving element 10 becomes stable, the above-described operations and effects more easily achieved.

Further, in the light detection device 1A, the underfill 40 reaches a position in which the light receiving element 10 is in contact with the light shielding layer 53 formed on the inner surface 51c of the opening 51 (that is, the first portion 53a of the light shielding layer 53). Accordingly, it is possible to obtain a stable fixing strength in the entire periphery of the light shielding mask 50. Furthermore, it is possible to prevent degradation in the light receiving element 10 due to the intrusion of moisture or the like from the side surface of the light receiving element 10.

Further, in the light detection device 1A, the plurality of light receiving portions 12 are arranged along a predetermined direction (in the light detection device 1A, the X-axis direction) and the light receiving element 10 and the light shielding mask 50 are formed in an elongated shape in which the predetermined direction is a longitudinal direction. When the plurality of light receiving portions 12 are arranged along the predetermined direction, the light is easily incident from the side surfaces of the light receiving elements 10 to all light receiving portions 12 and the strength of the light receiving elements 10 easily decrease. Thus, when the plurality of light receiving portions 12 are arranged along the predetermined direction, a configuration in which the light shielding mask 50 is provided and the underfill 40 reaches a gap between the light receiving element 10 and the light shielding layer 53 is particularly effective.

Further, in the light detection device 1A, the substrate 21 of the circuit element 20 and the frame 52 of the light shielding mask 50 are formed of silicon. Accordingly, it is possible to prevent the deformation of at least one of the circuit element 20 and the light shielding mask 50 due to a difference in thermal expansion coefficient between the substrate 21 of the circuit element 20 and the frame 52 of the light shielding mask 50.

Further, in the light detection device 1A, the substrate 11 of the light receiving element 10 is formed of a compound semiconductor. When the substrate 11 of the light receiving element 10 is formed of the compound semiconductor, the side surface 11c of the substrate 11 of the light receiving element 10 is easily chipped. Thus, when the substrate 11 of the light receiving element 10 is formed of the compound semiconductor, a configuration in which the light shielding mask 50 is provided and the underfill 40 reaches a gap between the light receiving element 10 and the light shielding layer 53 is particularly effective in order to suppress the chipping of the side surface 11c of the substrate 11 of the light receiving element 10. Furthermore, when the substrate 11 of the light receiving element 10 is formed of the compound semiconductor, the chipping or the like occurs on the side surface 11c of the substrate 11 of the light receiving element 10 at the time of manufacturing the light detection device in many cases. For this reason, when stray light is incident, the uniformity among the plurality of light receiving portions 12 is easily degraded due to the irregular reflection or the like. However, since the light shielding mask 50 is provided, the second opening edge 51b of the light shielding mask 50 is located at the inside in relation to the outer edge 10a of the light receiving element 10. For this reason, since the outer edge 10a of the light receiving element 10 is covered when viewed from the light incident direction, it is possible to suppress degradation in the uniformity among the plurality of light receiving portions 12 caused by the incident stray light. Thus, when the substrate 11 of the light receiving element 10 is formed of the compound semiconductor, a configuration in which the light shielding mask 50 is provided and the underfill 40 reaches a gap between the light receiving element 10 and the light shielding layer 53 is particularly effective in order to ensure the uniformity among the plurality of light receiving portions 12. Of course, such an effect is effective even when the substrate 11 of the light receiving element 10 is formed of a semiconductor (for example, silicon) other than the compound semiconductor.

Further, in the light detection device 1A, the light shielding layer 53 is formed on the surface 52a on the side of the circuit element 20 in the frame 52 in addition to the inner surface 51c of the opening 51. Accordingly, it is possible to prevent, for example, a problem in which the light incident to the circuit element 20 through the surface 52a on the side of the circuit element 20 in the frame 52 is scattered and is incident to the light receiving portion 12 of the light receiving element 10.

Further, in the light detection device 1A, the inclination angle of the inner surface 51c of the opening 51 is an angle equal to or larger than 30° and equal to or smaller than 60°. When the inclination angle is within this angle range, it is possible to sufficiently increase particularly the strength of the light shielding mask 50 and to appropriately control the raising of the underfill 40. Additionally, even when the inclination angle is an angle other than this angle range, such an effect is obtained.

Further, in the light detection device 1A, the underfill 40 reaches an intersection portion (in the light detection device 1A, the corner portion 11d) between the side surface of the light receiving element 10 (in the light detection device 1A, the side surface 11c) and the surface (in the light detection device 1A, the principal surface 11b) on the light incident side in the light receiving element 10. Furthermore, in the light detection device 1A, the underfill 40 reaches the outer edge of the surface on the light incident side in the light receiving element 19. Accordingly, since it is possible to cover the intersection portion between the surface on the light incident side in the light receiving element 10 and the side surface of the light receiving element 10 as well as the side surface of the light receiving element 10, it is possible to more stably fix the light receiving element 10. Furthermore, it is possible to more reliably suppress the intrusion of moisture onto the mounting surface of the light receiving element 10.

Figure 6:
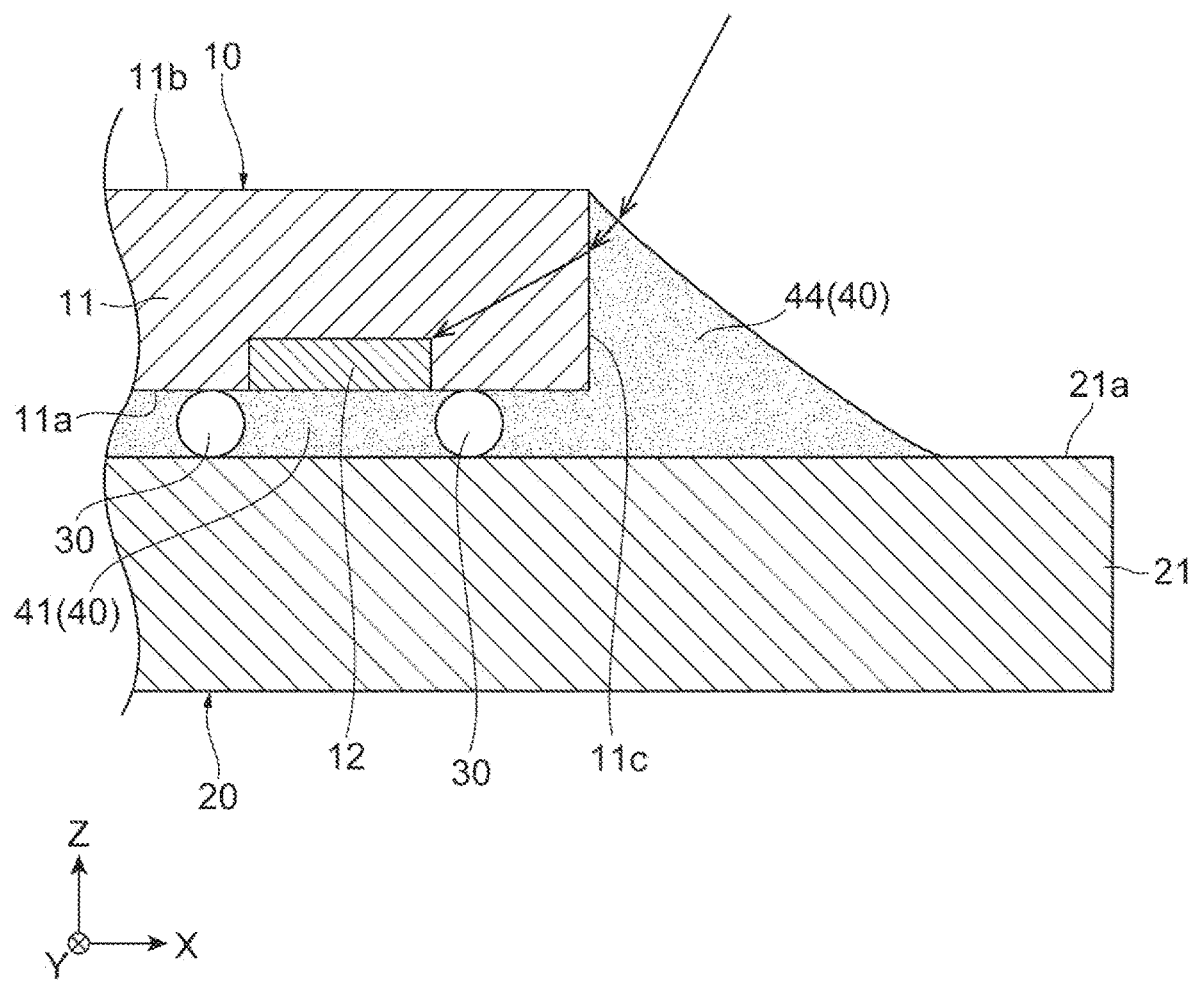
FIG. 6 is an enlarged cross-sectional view of a light detection device of a comparative example.
Figure 7:
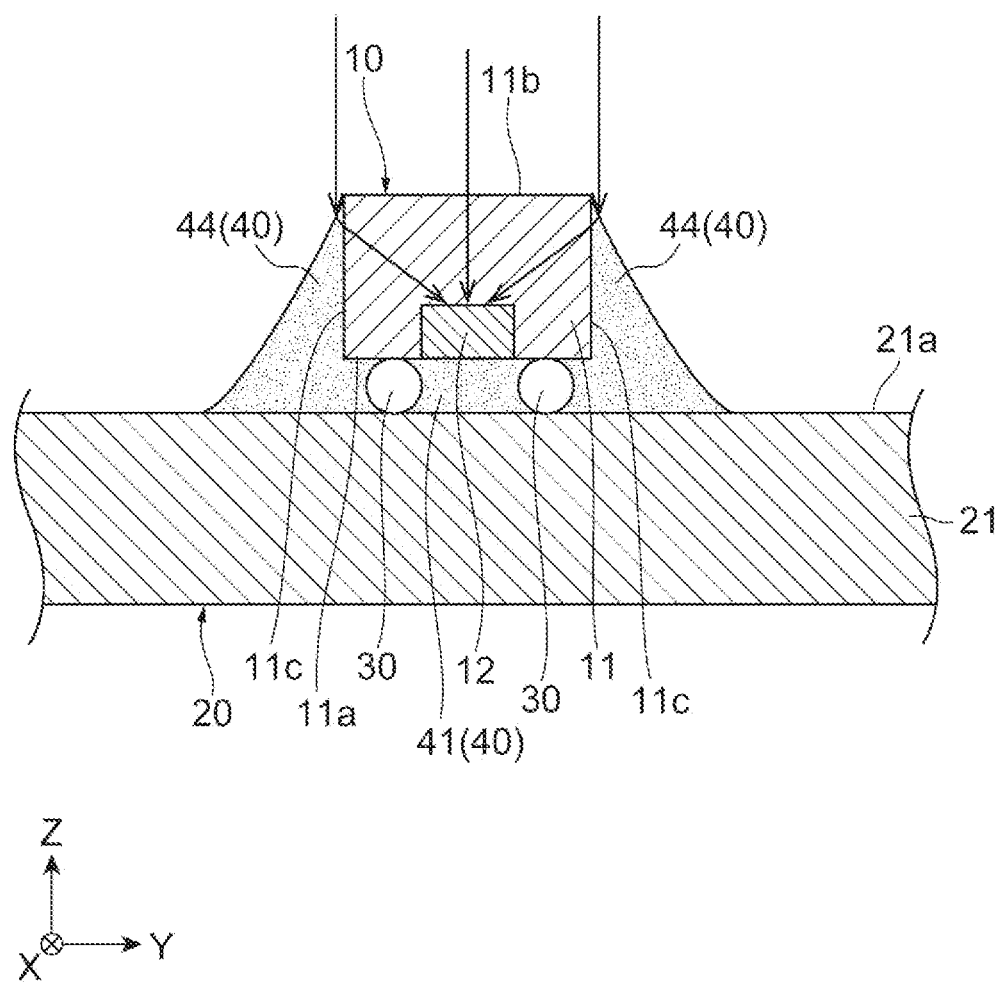
FIG. 7 is an enlarged cross-sectional view of the light detection device of the comparative example.

FIG. 6 is an enlarged cross-sectional view of a light detection device of a comparative example and illustrates a portion corresponding to FIG. 4. FIG. 7 is an enlarged cross-sectional view of the light detection device of the comparative example and illustrates a portion corresponding to FIG. 5. The light detection device of the comparative example illustrated in FIGS. 6 and 7 is chiefly different from the light detection device 1A of the above-described first embodiment in that the light shielding mask 50 is not provided. In the light detection device of the comparative example, the underfill 40 is raised on the side surface 11c of the substrate 11 in the periphery of the light receiving element 10. For this reason, the following problem can be generated.

As illustrated in FIG. 6, when light is incident to a portion 44 located at both sides of the light receiving element 10 in the X-axis direction in the underfill 40, there is concern that the light is refracted on the surface of the portion 44 and the boundary face between the portion 44 and the side surface 11c of the substrate 11 and is incident from the side surface 11c of the substrate 11 to the light receiving portions 12 of both ends. In this case, since noise light is detected by the light receiving portions 12 of both ends, the uniformity among the plurality of light receiving portions 12 arranged in one dimension along the X-axis direction is degraded. This is a problem peculiar to the back-illuminated light receiving element 10.

Further, as illustrated in FIG. 7, when light is incident to the portions 44 located at both sides of the light receiving element 10 in the Y-axis direction of the underfill 40, there is concern that the light is refracted on the surface of the portion 44 and the boundary face between the portion 44 and the side surface 11c of the substrate 11 and is incident from the side surface 11c of the substrate 11 to the light receiving portion 12. Such a phenomenon can be generated in all of the plurality of light receiving portions 12 arranged in one dimension along the X-axis direction. In this case, when an object is relatively moved along the Y-axis direction to acquire a two-dimensional image of the object, a ghost image appears at the front and rear sides in a direction corresponding to the Y-axis direction with respect to the image of the object. This is a problem peculiar to the back-illuminated light receiving element 10.

Compared to the light detection device of the comparative example, the light detection device 1A of the above-described first embodiment includes the light shielding mask 50. For this reason, according to the light detection device 1A of the above-described first embodiment, it is possible to solve degradation in uniformity and the appearance of the ghost image (the problem peculiar to the back-illuminated light receiving element 10).

Second Embodiment

Figure 8:
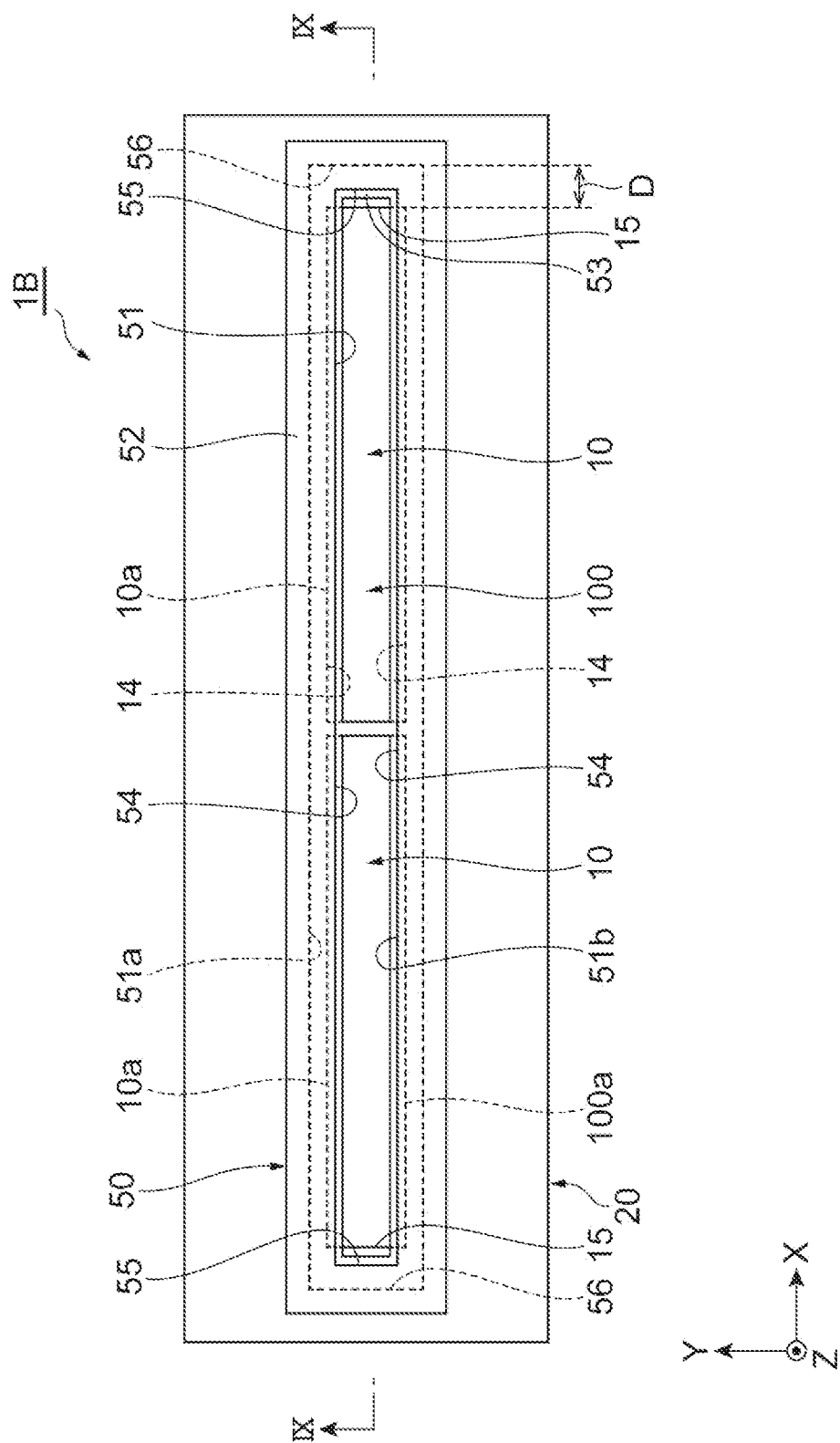
FIG. 8 is a plan view of a light detection device of a second embodiment.
Figure 9:
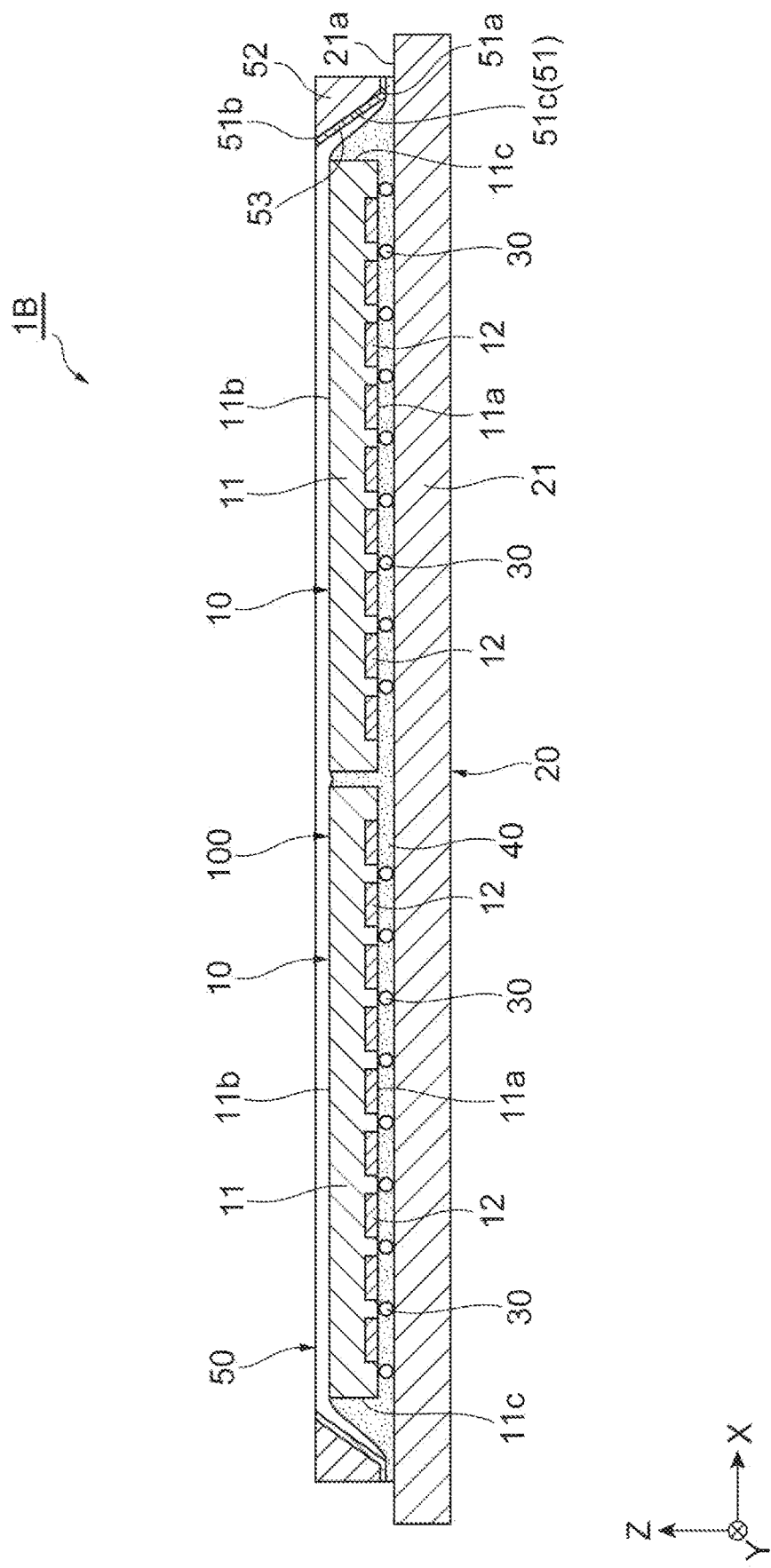
FIG. 9 is a cross-sectional view of the light detection device taken along a line IX-IX illustrated in FIG. 8.

As illustrated in FIGS. 8 and 9, a light detection device 1B of a second embodiment is different from the light detection device 1A of the first embodiment in that a light receiving element unit 100 includes the plurality of light receiving elements 10 and a part of the second opening edge 51b of the light shielding mask 50 is located at the outside of an outer edge 100a of the light receiving element unit 100. Except for these differences, one light receiving element 10 of the light detection device 1A of the first embodiment can be read as the light receiving element unit 100 of the light detection device 1B of the second embodiment. Thus, according to the light detection device 1B of the second embodiment, the same operations and effects as those of the light detection device 1A of the first embodiment are obtained. Hereinafter, the above-described differences will be described in detail.

In the light detection device 1B, two light receiving elements 10 are arranged in one dimension along the X-axis direction. A portion along the principal surface 11a of the substrate 11 of each light receiving element 10 is provided with a plurality of light receiving portions 12. The plurality of light receiving portions 12 are arranged in one dimension along the X-axis direction. Each light receiving element 10 is formed in an elongated shape in which the X-axis direction is the longitudinal direction. As an example, each light receiving element 10 is formed in a rectangular plate shape in which the X-axis direction is the longitudinal direction. In this way, each light receiving element 10 is a one-dimensional image sensor and two light receiving elements 10 are arranged in parallel in a direction in which a plurality of light receiving portions 12 serving as a plurality of pixels are arranged. Furthermore, for example, a gap of about 5 μm is formed between the adjacent light receiving elements 10 and the underfill 40 enters the gap. That is, the underfill 40 is disposed between the adjacent light receiving elements 10. In each light receiving element 10, the light receiving portion 12 closest to the gap is set as a dummy and an electric signal output from the light receiving portion 12 may not be used to generate an image.

When viewed from the Z-axis direction, both end portions of the second opening edge 51b of the light shielding mask 50 in the X-axis direction are located at the outside of both end portions of the outer edge 100a of the light receiving element unit 100 in the X-axis direction. Accordingly, a portion between one end portion of the light receiving element unit 100 in the X-axis direction and one end portion of the light shielding mask 50 in the X-axis direction and a portion between the other end portion of the light receiving element unit 100 in the X-axis direction and the other end portion of the light shielding mask 50 in the X-axis direction can serve as an underfill releasing hole at the time of manufacturing the light detection device 1B and can suppress an extra underfill 40 from protruding from the surface on the light incident side in each light receiving element 10 in the manufactured light detection device 1B. Furthermore, the outer edge 100a of the light receiving element unit 100 when viewed from the Z-axis direction is defined by an outer portion excluding the adjacent inner portions in the outer edges 10a of the light receiving elements 10 when viewed from the Z-axis direction.

As an example, a pair of sides 54 facing each other in the Y-axis direction of the second opening edge 51b is located at the inside of a pair of sides 14 facing each other in the Y-axis direction of the outer edge 100a of the light receiving element unit 100 when viewed from the Z-axis direction. Meanwhile, a pair of sides 55 facing each other in the X-axis direction of the second opening edge 51b is located at the outside of a pair of sides 15 facing each other in the X-axis direction of the outer edge 100a of the light receiving element unit 100 when viewed from the Z-axis direction.

Figure 10:
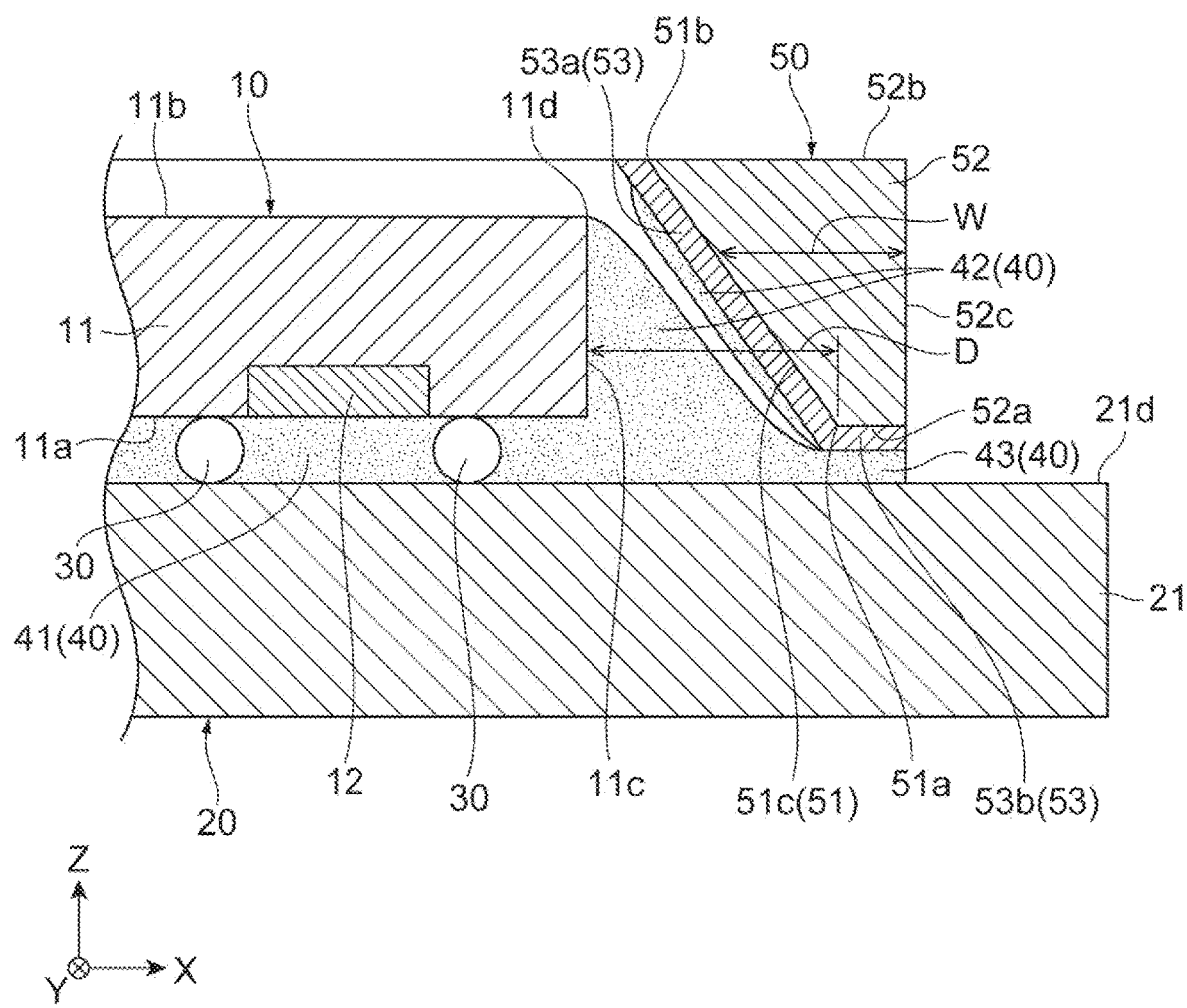
FIG. 10 is an enlarged cross-sectional view of the light detection device illustrated in FIG. 9.

As illustrated in FIG. 10, in both end portions of the light shielding mask 50 in the X-axis direction, the second portion 42 of the underfill 40 creeps up on the side surface 11c of the substrate 11 and the surface of the first portion 53a of the light shielding layer 53. The second portion 42 which creeps up on the side surface 11c of the substrate 11 reaches the corner portion 11d of the substrate 11. A groove-shaped concave portion is formed between the second portion 42 creeping up on the side surface 11c of the substrate 11 and the second portion 42 creeping up on the surface of the first portion 53a of the light shielding layer 53. When the underfill resin creeps up on the surface of the first portion 53a of the light shielding layer 53 at the time of manufacturing the light detection device 1B, it is possible to more reliably suppress an extra underfill 40 from protruding from the surface on the light incident side in each light receiving element 10 in the manufactured light detection device 1B. However, there is a case in which the second portion 42 of the underfill 40 creeps up on the side surface 11c of the substrate 11 and the surface of the first portion 53a of the light shielding layer 53 and a groove-shaped concave portion is not formed between the second portion 42 creeping up on the side surface 11c of the substrate 11 and the second portion 42 creeping up on the surface of the first portion 53a of the light shielding layer 53. Further, there is a case in which the second portion 42 of the underfill 40 creeps up on the side surface 11c of the substrate 11 and does not creep up on the surface of the first portion 53a of the light shielding layer 53.

Figure 11:
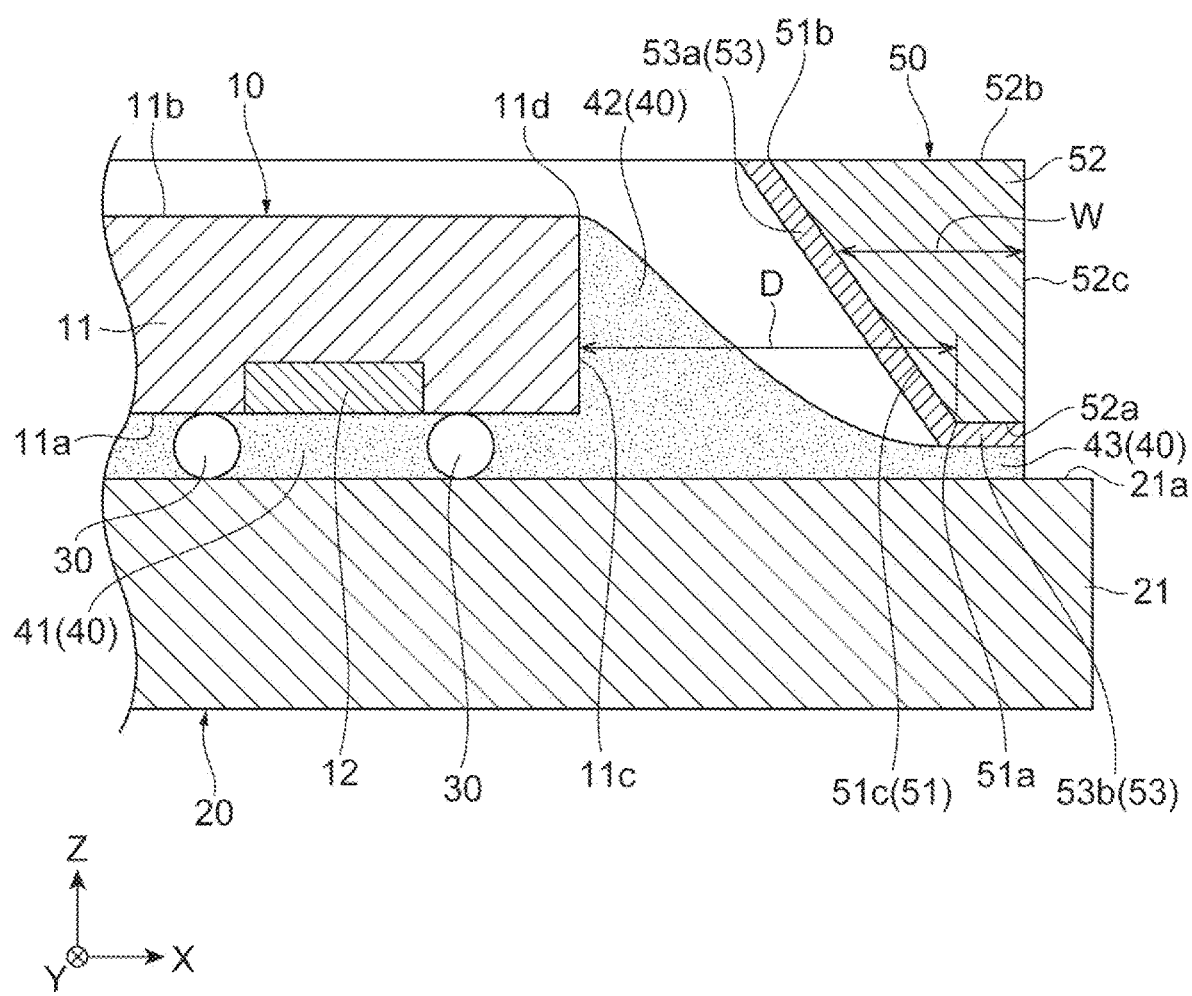
FIG. 11 is an enlarged cross-sectional view of a modified example of the light detection device of the second embodiment.

As illustrated in FIG. 8, each of a pair of sides 56 facing each other in the X-axis direction of the first opening edge 51a of the light shielding mask 50 is separated from each of the pair of sides 15 facing each other in the X-axis direction of the outer edge 100a of the light receiving element unit 100 by a distance D when viewed from the Z-axis direction. As illustrated in FIG. 10, when the distance D is smaller than 200 μm, it is possible to suppress light from being incident from the side surface 11c of the substrate 11 into the light receiving portions 12 of both ends. As a result, it is possible to suppress deterioration in uniformity between the plurality of light receiving portions 12 arranged in one dimension along the X-axis direction. Meanwhile, as illustrated in FIG. 11, when the distance D is equal to or larger than 200 μm, it is possible to reliably exhibit the function of the underfill resin releasing hole at the time of manufacturing the light detection device 1B and to more reliably suppress an extra underfill 40 from protruding from the surface on the light incident side in each light receiving element 10 in the manufactured light detection device 1B. Furthermore, in any one of the cases of FIGS. 10 and 11, the light receiving portions 12 of both ends in the X-axis direction of each light receiving element 10 are set as a dummy and an electric signal output from the light receiving portion 12 may not be used to generate an image.

Modified Example

The present disclosure is not limited to the above-described first and second embodiments. For example, the materials and shapes of components are not limited to the above-described materials and shapes and various materials and shapes can be employed. As an example, the material of the substrate 11 of the light receiving element 10 is not limited to the compound semiconductor such as InGaAs and may be silicon or the like. Further, the substrate 21 of the circuit element 20 and the frame 52 of the light shielding mask 50 may be formed of a material (for example, resin, ceramic, or the like) other than silicon. Here, when the substrate 21 of the circuit element 20 and the frame 52 of the light shielding mask 50 are formed of the same material, it is possible to prevent the deformation of at least one of the circuit element and the light shielding mask 50 due to a difference in thermal expansion coefficient between the substrate 21 of the circuit element 20 and the frame 52 of the light shielding mask 50.

Further, the inclination angle of the inner surface 51c of the opening 51 does not need to be uniform and the inclination angle may decrease or increase, for example, from the first opening edge 51a toward the second opening edge 51b. For example, when the inner surface 51c of the opening 51 is a concave curved surface in a cross-section parallel to the Z-axis direction, the inclination angle decreases from the first opening edge 51a toward the second opening edge 51b. For example, when the inner surface 51c of the opening 51 is a convex curved surface in a cross-section parallel to the Z-axis direction, the inclination angle increases from the first opening edge 51a toward the second opening edge 51b. Further, the shape of the opening 51 may be, for example, a shape obtained by the combination of the vertical hole and the tapered hole. That is, the opening 51 which is narrowed from the first opening edge 51a toward the second opening edge 51b may be formed so that a partially uniform portion exists or a partially enlarged portion exists as long as the opening is narrowed on the whole. Here, when the opening 51 is continuously narrowed from the first opening edge 51a toward the second opening edge 51b, it is possible to allow an appropriate amount of the underfill 40 to flow between the light receiving element 10 and the first portion 53a of the light shielding layer 53 while ensuring the mechanical strength of the light shielding mask 50. Furthermore, since there is no unnecessary portion in the shape of the opening 51, it is possible to realize a decrease in size of the light detection devices 1A and 1B.

Further, when the width W of the frame 52 increases from the first opening edge 51a toward the second opening edge 51b on the whole, a partially uniform portion may exist or a partially narrowed portion may exist. Here, when the width W of the frame 52 continuously increases from the first opening edge 51a toward the second opening edge 51b, it is possible to decrease the size of the light detection devices 1A and 1B while ensuring the mechanical strength of the light shielding mask 50. Further, the width W of the frame 52 does not need to be uniform in all portions and the width W of the frame 52 illustrated in FIG. 4 and the width W of the frame 52 illustrated in FIG. may be the same or different.

Further, in the light detection devices 1A and 1B of the above-described first and second embodiments, the underfill 40 may not reach a region between the circuit element 20 and the second portion 53b of the light shielding layer 53 (that is, the light shielding layer 53 formed on the surface 52a of the frame 52). Further, the light shielding layer 53 may not be formed on the surface 52a of the frame 52 as long as the light shielding layer is formed on the inner surface 51c of the opening 51. Also in such a case, it is possible to obtain the same operations and effects as those of the light detection devices 1A and 1B of the above-described first and second embodiments.

In the light detection devices 1A and 1B of the above-described first and second embodiments, the light receiving element 10 is in contact with the first portion 53a of the light shielding layer 53 and the bottom surface of the light shielding mask 50 (the surface 52a of the frame 52 or the second portion 53b of the light shielding layer 53) is separated from the circuit element 20. However, the light detection devices 1A and 1B may have the following configuration. That is, the light receiving element 10 may be separated from the first portion 53a of the light shielding layer 53 and the bottom surface of the light shielding mask 50 may be in contact with the circuit element 20. Alternatively, the light receiving element 10 may be in contact with the first portion 53a of the light shielding layer 53 and the bottom surface of the light shielding mask 50 may be in contact with the circuit element 20. Alternatively, the light receiving element 10 may be separated from the first portion 53a of the light shielding layer 53 and the bottom surface of the light shielding mask 50 may be separated from the circuit element 20. In any case, when the underfill 40 reaches a gap between the light receiving element 10 and the first portion 53a of the light shielding layer 53, the underfill may not reach the outer edge of the surface on the light incident side in the light receiving element 10 and may not reach the intersection portion between the surface on the light incident side in the light receiving element 10 and the side surface of the light receiving element 10. Further, the underfill 40 may not reach a gap between the bottom surface of the light shielding mask 50 and the circuit element 20. When the underfill 40 reaches a gap between the light receiving element 10 and the first portion 53a of the light shielding layer 53 in a case in which the light receiving element 10 is in contact with the first portion 53a of the light shielding layer 53, the light receiving element 10 may not reach a contact position with the first portion 53a of the light shielding layer 53. That is, the underfill 40 may reach (contact) a gap between at least a part of the side surface of the light receiving element 10 (in the light detection devices 1A and 1B, the side surface 11c of the substrate 11) and at least a part of the first portion 53a of the light shielding layer 53.

Additionally, even when the light receiving element 10 is in contact with the first portion 53a of the light shielding layer 53, there is no need to allow the first portion 53a of the light shielding layer 53 to contact, for example, the entirety of the corner portion 11d of the substrate 11 of the light receiving element 10. In the present specification, the expression of the "contact" means that at least a part of components physically contact to each other.

Further, the light receiving element 10 may have a configuration in which the plurality of light receiving portions 12 are arranged in two dimensions. Further, the light receiving element 10 is not limited to a configuration in which the second conductive region is formed in a portion along the principal surface 11a of the first conductive substrate 11. For example, the second conductive region may be formed in a region along the principal surface 11a of the first conductive substrate 11 and the first conductive region may be formed inside the region. That is, the light receiving element 10 may have any configuration as long as the back-illuminated light receiving element is provided. Further, the circuit element 20 may be a member simply provided with a wiring. Further, the circuit element 20 may include a substrate formed of a material other than the semiconductor material. Further, the shape of the circuit element 20 is not limited to the substrate and may have, for example, a shape like a casing with a concave portion.

Further, an optical element such as a filter may be mounted on the surface 52b of the frame 52. Further, the light shielding layer 53 is not limited to a layer (a light reflection layer) having a function of reflecting light and may be a layer (a light absorption layer) having a function of absorbing light. For example, when the light shielding layer 53 is formed of indium tin oxide (ITO), antimony tin oxide (ATO), lanthanum hexaboride (LaB$_6$), cesium tungsten oxide, or the like, the light shielding layer 53 may be formed as a light absorption layer. However, it is desirable that the light shielding layer 53 is the light reflection layer from the viewpoint of suppressing the generation of heat. Further, the light receiving element 10 and the circuit element 20 may be electrically and physically connected to each other by, for example, an anisotropic conductive resin layer instead of the bump 30. In that case, in the anisotropic conductive resin layer, a portion between the electrode pads facing each other in the Z-axis direction serves as a connection member and a portion other than the connection member serves as the underfill 40 (that is, the underfill reaches a gap between the light receiving element 10 and the first portion 53a of the light shielding layer 53 as well as a gap between the light receiving element and the circuit element 20).

Further, the underfill 40 may reach a corner portion formed by the principal surface 21a of the substrate 21 of the circuit element 20 and the side surface 52c of the frame 52 of the light shielding mask 50 through a region between the circuit element 20 and the light shielding mask 50. Accordingly, since the fixing of the light shielding mask 50 with respect to the circuit element 20 is reinforced, the stability of the device is improved.

Further, in the light detection device 1A of the first embodiment, all of the second opening edge 51b are located at the inside of the outer edge 10a of the light receiving element 10 when viewed from the Z-axis direction, but a part of the second opening edge 51b may be located at the outside of the outer edge 10a of the light receiving element 10 when viewed from the Z-axis direction. That is, at least a part of the second opening edge 51b may be located at the inside of the outer edge 10a of the light receiving element 10 when viewed from the Z-axis direction. In the light detection device 1A of the first embodiment, one end portion of the second opening edge 51b in the X-axis direction may be located at the outside of one end portion of the outer edge 10a of the light receiving element 10 in the X-axis direction when viewed from the Z-axis direction. Accordingly, a portion between one end portion of the light receiving element 10 in the X-axis direction and one end portion of the light shielding mask 50 in the X-axis direction can serve as an underfill resin releasing hole at the time of manufacturing the light detection device 1A and can suppress an extra underfill 40 from protruding from the surface on the light incident side in the light receiving element 10 in the manufactured light detection device 1A. Furthermore, considering the stability of the device, both end portions of the second opening edge 51b in the X-axis direction are preferably located at the outside of both end portions of the outer edge 10a of the light receiving element 10 in the X-axis direction when viewed from the Z-axis direction.

Further, in the light detection device 1B of the second embodiment, the light receiving element unit 100 includes two light receiving elements 10 arranged in one dimension along the X-axis direction, but the light receiving element unit 100 may include a plurality of light receiving elements 10 arranged in one dimension or two dimensions along the surface on the side of the light receiving element unit 100 in the circuit element 20. Accordingly, it is possible to increase the size of the light receiving element unit 100 while suppressing a decrease in yield and a decrease in mechanical strength. Furthermore, also in that case, each light receiving element 10 may have a configuration in which a plurality of light receiving portions 12 are arranged in two dimensions. Further, the plurality of light receiving elements 10 constituting one light receiving element unit 100 may not have the same size.

According to the present disclosure, it is possible to provide the highly reliable light detection device.

What is claimed is:

1. A light detection device comprising:
   a back-illuminated light receiving element including a plurality of light receiving portions;
   a circuit element;
   a connection member disposed between the light receiving element and the circuit element and configured to electrically and physically connect the light receiving element and the circuit element to each other;
   an underfill disposed between the light receiving element and the circuit element; and
   a frame-shaped light shielding mask disposed on the circuit element to surround the light receiving element when viewed from a light incident direction to the light receiving element,
   wherein the light shielding mask includes a frame having an opening in which the light receiving element is located,
   wherein a first opening edge on the side of the circuit element in the opening is located at the outside of an outer edge of the light receiving element when viewed from the light incident direction,
   wherein the opening is narrowed from the first opening edge toward a second opening edge opposite to the circuit element in the opening,
   wherein a width of the frame increases from the first opening edge toward the second opening edge, and
   wherein the underfill reaches a gap between the light receiving element and an inner surface of the opening of the light shielding mask.
2. The light detection device according to claim 1, wherein the light receiving element is in contact with the inner surface of the opening of the light shielding mask.
3. The light detection device according to claim 2, wherein the underfill reaches a position in which the light receiving element is in contact with the inner surface of the opening of the light shielding mask.
4. The light detection device according to claim 1, wherein the plurality of light receiving portions are arranged along a predetermined direction, and wherein the light receiving element and the light shielding mask have an elongated shape in which the predetermined direction is a longitudinal direction.
5. The light detection device according to claim 1, wherein the frame and a substrate of the circuit element are formed of the same material.
6. The light detection device according to claim 5, wherein the frame and the substrate of the circuit element are formed of silicon.
7. The light detection device according to claim 1, wherein a substrate of the light receiving element is formed of a compound semiconductor.
8. The light detection device according to claim 1, wherein the underfill reaches a portion in which a surface on the light incident side in the light receiving element intersects a side surface of the light receiving element.
9. The light detection device according to claim 8, wherein the underfill reaches an outer edge of the surface on the light incident side in the light receiving element.
10. The light detection device according to claim 4, wherein the frame and a substrate of the circuit element are formed of the same material.
11. The light detection device according to claim 10, wherein the frame and the substrate of the circuit element are formed of silicon.
12. The light detection device according to claim 4, wherein a substrate of the light receiving element is formed of a compound semiconductor.
13. The light detection device according to claim 5, wherein the substrate of the light receiving element is formed of a compound semiconductor.
14. The light detection device according to claim 10, wherein the substrate of the light receiving element is formed of a compound semiconductor.
15. The light detection device according to claim 6, wherein the substrate of the light receiving element is formed of a compound semiconductor.
16. The light detection device according to claim 11, wherein the substrate of the light receiving element is formed of a compound semiconductor.
17. The light detection device according to claim 4, wherein, when viewed from the light incident direction, at least one end portion of the second opening edge in the predetermined direction is located at the outside of at least one end portion of the outer edge of the light receiving element in the predetermined direction.
18. A light detection device comprising:
   a light receiving element unit including a plurality of back-illuminated light receiving elements respectively including a plurality of light receiving portions;
   a circuit element;
   a connection member disposed between the light receiving element unit and the circuit element and configured to electrically and physically connect the light receiving element unit and the circuit element to each other;
   an underfill disposed between the light receiving element unit and the circuit element; and
   a frame-shaped light shielding mask disposed on the circuit element to surround the light receiving element unit when viewed from a light incident direction to the light receiving element unit, wherein the light shielding mask includes a frame having an opening in which the light receiving element unit is located, wherein a first opening edge on the side of the circuit element in the opening is located at the outside of an outer edge of the light receiving element unit when viewed from the light incident direction, wherein the opening is narrowed from the first opening edge toward a second opening edge opposite to the circuit element in the opening, wherein a width of the frame increases from the first opening edge toward the second opening edge, and wherein the underfill reaches a gap between the light receiving element unit and an inner surface of the opening of the light shielding mask.

19. The light detection device according to claim 18, wherein the light receiving element unit is in contact with the inner surface of the opening of the light shielding mask.

20. The light detection device according to claim 19, wherein the underfill reaches a position in which the light receiving element unit is in contact with the inner surface of the opening of the light shielding mask.

21. The light detection device according to claim 18, wherein the plurality of light receiving portions are arranged along a predetermined direction, and
wherein the light receiving element unit and the light shielding mask have an elongated shape in which the predetermined direction is a longitudinal direction.

22. The light detection device according to claim 18, wherein the frame and a substrate of the circuit element are formed of the same material.

23. The light detection device according to claim 22, wherein the frame and the substrate of the circuit element are formed of silicon.

24. The light detection device according to claim 18, wherein a substrate of each of the plurality of light receiving elements is formed of a compound semiconductor.

25. The light detection device according to claim 18, wherein the underfill reaches a portion in which a surface on the light incident side in the light receiving element unit intersects a side surface of the light receiving element unit.

26. The light detection device according to claim 25, wherein the underfill reaches an outer edge of the surface on the light incident side in the light receiving element unit.

27. The light detection device according to claim 21, wherein the frame and a substrate of the circuit element are formed of the same material.

28. The light detection device according to claim 27, wherein the frame and the substrate of the circuit element are formed of silicon.

29. The light detection device according to claim 21, wherein a substrate of each of the plurality of light receiving elements is formed of a compound semiconductor.

30. The light detection device according to claim 22, wherein a substrate of each of the plurality of light receiving elements is formed of a compound semiconductor.

31. The light detection device according to claim 27, wherein a substrate of each of the plurality of light receiving elements is formed of a compound semiconductor.

32. The light detection device according to claim 23, wherein a substrate of each of the plurality of light receiving elements is formed of a compound semiconductor.

33. The light detection device according to claim 28, wherein a substrate of each of the plurality of light receiving elements is formed of a compound semiconductor.

34. The light detection device according to claim 21, wherein, when viewed from the light incident direction, at least one end portion of the second opening edge in the predetermined direction is located at the outside of at least one end portion of the outer edge of the light receiving element unit in the predetermined direction.

* * * * *